United States Patent
Guo et al.

(10) Patent No.: US 6,828,623 B1
(45) Date of Patent: Dec. 7, 2004

(54) FLOATING GATE MEMORY DEVICE WITH HOMOGENEOUS OXYNITRIDE TUNNELING DIELECTRIC

(75) Inventors: Xin Guo, Mountain View, CA (US); Nian Yang, San Jose, CA (US); Zhigang Wang, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/232,487

(22) Filed: Aug. 30, 2002

(51) Int. Cl.[7] ............................................. H01L 29/788
(52) U.S. Cl. ....................... 257/321; 257/314; 257/315; 257/316; 438/257
(58) Field of Search ................................. 257/314–316, 257/320–322; 438/257, 263, 287

(56) References Cited

U.S. PATENT DOCUMENTS

| | | | | |
|---|---|---|---|---|
| 5,904,523 A | * | 5/1999 | Feldman et al. | 438/263 |
| 6,143,607 A | * | 11/2000 | Chi | 438/257 |
| 6,248,633 B1 | * | 6/2001 | Ogura et al. | 438/267 |
| 6,384,448 B1 | * | 5/2002 | Forbes | 257/315 |
| 6,525,970 B2 | * | 2/2003 | Wang et al. | 365/185.29 |
| 6,559,007 B1 | * | 5/2003 | Weimer | 438/257 |
| 6,610,614 B2 | * | 8/2003 | Niimi et al. | 438/775 |
| 2002/0072177 A1 | * | 6/2002 | Grider | 438/287 |

OTHER PUBLICATIONS

Yu et al., Investigation of hole–tunneling current through ultrathin oxynitride/oxide stack gate dielectrics in p–MOSFETs, *IEEE Trans. Elec. Devices*, 49 (Jul. 2002) 1158.*

Hattangady et al., Integrated processing of silicon oxynitride films by combined plasma and rapid–thermal processing, *J. Vac. Sci. Technol. A*, 14 (Nov./Dec. 1996) 3017.*

* cited by examiner

*Primary Examiner*—Richard Elms
*Assistant Examiner*—Christian D. Wilson

(57) ABSTRACT

A memory device with homogeneous oxynitride tunneling dielectric. Specifically, the present invention describes a flash memory cell that includes a tunnel oxide dielectric layer including homogeneous oxynitride. The tunnel oxide dielectric layer separates a floating gate from a channel region that is formed between a source region and a drain region in a substrate. The flash memory cell further includes a dielectric layer that separates a control gate from the floating gate. In one case, the homogenous oxynitride is a defect free silicon nitride. The homogeneity of the oxynitride is due to the uniform distribution of nitride within the tunnel oxide dielectric layer. Further, the use of the homogeneous oxynitride can increase the dielectric constant and lower the barrier height of the tunnel oxide dielectric layer for increased performance. Also, the homogenous oxynitride supports source-side channel hot hole erasing in the flash memory cell.

27 Claims, 11 Drawing Sheets

FLOATING GATE MEMORY DEVICE WITH HOMOGENEOUS OXYNITRIDE TUNNELING DIELECTRIC

TECHNICAL FIELD

The present invention relates to the field of microelectronic integrated circuits. Specifically, the present invention relates to a memory device including a homogeneous oxynitride tunneling dielectric layer.

BACKGROUND ART

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. The flash memory cell provides for nonvolatile data storage.

Prior Art FIG. 1 illustrates a typical configuration of a flash memory cell 100. The transistor typically consists of a thin, high-quality tunnel oxide layer 140 sandwiched between a conducting polysilicon floating gate 130 and a crystalline silicon semiconductor substrate 170. The tunnel oxide layer is typically composed of silicon oxide ($Si_xO_y$). The substrate 170 includes a source region 150 and a drain region 160 that can be separated by an underlying channel region. A control gate 110 is provided adjacent to the floating gate 130, and is separated by an interpoly dielectric 120. Typically, the interpoly, dielectric 120 can be composed of an oxide-nitride-oxide (ONO) structure.

The flash memory cell 100 stores data by holding charge within the floating gate 130. In a write operation, charge can be placed on the floating gate 130 through hot electron injection, or Fowler-Nordheim (F-N) tunneling. In addition, F-N tunneling can be typically used for erasing the flash memory cell 100 through the removal of charge on the floating gate 130.

As flash memory technology progresses, the density of the memory cells, as well as, the speed of the flash memory increases. However, the continued reduction in size of the conventional floating gate flash memory cell 100 has been essentially limited by two primary effects: first, a minimum thickness of the tunnel oxide dielectric 140 that limits capacitance of the flash memory cell 100; and second, the inability to reduce the higher operating voltages affecting the flash memory cell 100.

First, in order to improve short channel effects and to increase core gain (Id/W), the unit area capacitance of the tunnel oxide dielectric 140 could be increased. Correspondingly, a higher unit area capacitance also leads to better retention of charge within the floating gate 130.

In the prior art, the thickness of the tunnel oxide dielectric 140 between the floating gate 130 and the substrate 170 can be reduced to obtain higher unit area capacitance. Unit area capacitance is inversely related to the thickness of the tunnel oxide dielectric 140. However, a thinner tunnel oxide dielectric 140 also leads to an increase in tunneling probability. This eventually leads to increased charge loss in the floating gate 130 over the lifetime of the flash memory device 100. As a result, a minimum thickness of approximately 10 nanometers (nm) is necessary to negate long term reliability degradation due to increased probability of charge loss due to thinner and thinner tunnel oxide layers 140 composed of silicon oxide. Thus, unit area capacitance of the tunnel oxide dielectric 140 is limited by the minimum thickness of the tunnel oxide dielectric 140.

Second, as the flash memory cell 100 becomes smaller and smaller, a corresponding reduction in operating voltage over the flash memory cell 100 must occur in order to maintain long-term longevity of the flash memory cell 100. A reduction in physical size of the flash memory cell 100 must be accompanied by a reduction in operating voltages to maintain relatively proportional electrical fields within the flash memory cell 100. For example, subjecting the smaller flash memory device to the same operating voltages as the previously larger device would result in quicker breakdown of the device in the channel region across the source region 150 and the drain region 160.

For example, programming and erasing of the flash memory device can involve electron injection by either F-N tunneling or channel hot electron (CHE) injection. Both F-N tunneling and CUE injection are controlled by the barrier height of the tunnel oxide dielectric 140. As such, in order to reduce operating voltages, a barrier energy of the tunnel oxide dielectric 140 must be reduced.

Conventionally, the tunnel oxide dielectric 140 that is composed of silicon oxide gives a very high barrier energy. Prior Art FIG. 2 is a diagram illustrating the electron and hole barrier energies for silicon oxide tunnel oxide dielectric 140 having a dielectric constant $\xi_{oxide}$ of 3.9. As illustrated, the barrier height for electron movement is approximately 3.15 electron volts (eV). The high operating voltages required for electrons to overcome the barrier height of 3.15 eV precludes continued reduction in the size of the flash memory cell 100. In addition, the barrier height for hole movement is approximately 5.0 eV, which is prohibitively high for any hole movement under conventional operating voltages. As a result, hole movement in the prior art is not a factor in any programming or erasing scheme.

Thus, a need exists for a flash memory cell with higher unit area capacitance for better charge retention, short channel effects, and increased core gain, while enjoying the benefits of reduction in size of the flash memory cell. A further need exists for a flash memory cell adapted to operate under lower voltages while simultaneously reducing the size of the flash memory cell.

DISCLOSURE OF THE INVENTION

The present invention provides a flash memory cell with higher unit area capacitance for better charge retention, short channel effects, and increased core gain, along with a reduction in size of the flash memory cell. Also, the present invention provides for a flash memory cell adapted to operate under lower voltages necessary for operation with a reduction in size of the flash memory cell.

Specifically, one embodiment of the present invention discloses a flash memory cell that comprises a tunnel oxide dielectric layer comprised of homogeneous oxynitride. The tunnel oxide dielectric layer separates a floating gate from a channel region that is formed between a source region and a drain region in a substrate. The flash memory cell further comprises a dielectric layer, such as an oxide-nitride-oxide (ONO) layer, that separates a control gate from the floating gate.

By varying the oxygen and nitrogen content in the homogeneous oxynitride, the flash memory cell can benefit from an increase in the dielectric constant, which leads to higher unit area capacitance for better charge retention in the floating gate. Also, the use of homogeneous oxynitride leads to lowered barrier heights in the tunnel oxide dielectric layer which can allow for reduced operating voltages.

The homogeneity of the oxynitride is due to the uniform distribution of nitride within the tunnel oxide dielectric layer between the channel region and the floating gate. In one embodiment, the homogenous oxynitride is a defect free silicon nitride.

Moreover, homogenous oxynitride is associated with lowered hole barrier height which enables a more efficient erasure scheme. For example, with silicon nitride, the hole barrier height can be reduced to 3.5 eV, from the 5.0 eV associated with Fowler-Nordheim (F-N) tunneling, thereby supporting source-side channel hot hole injection (SSCHHI) erasing in the flash memory cell. The SSCHHI erasing scheme can be implemented at much lower voltages than the F-N erasing scheme.

BRIEF DESCRIPTION OF THE DRAWINGS

PRIOR ART

PRIOR ART

BEST MODES FOR CARRYING OUT THE INVENTION

Reference will now be made in detail to the preferred embodiments of the present invention, a flash memory cell including a tunnel oxide dielectric composed of homogeneous oxynitride. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a flash memory cell with higher unit area capacitance for better charge retention, short channel effects, and increased core gain, along with a reduction in size of the flash memory cell. Also, the present invention discloses a flash memory cell adapted to operate under lower voltages necessary for operation with a reduction in size of the flash memory cell.

Figure 3:
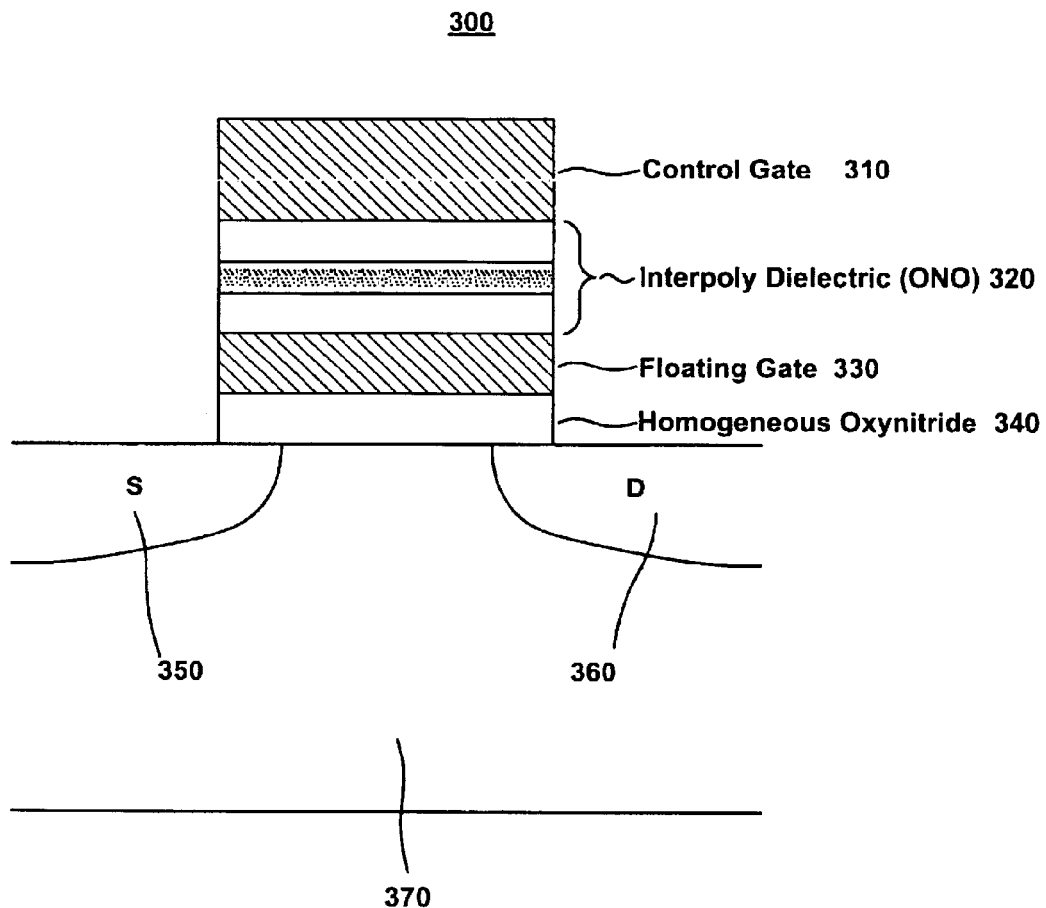
FIG. 3 is a cross sectional view of a semiconductor flash memory cell including a tunnel oxide dielectric composed of homogenous oxynitride, in accordance with one embodiment of the present invention.

Embodiments of the present invention disclose a flash memory cell including a tunnel oxide dielectric composed of homogeneous oxynitride. FIG. 3 is a cross-sectional diagram of flash memory cell 300 including a tunnel oxide dielectric 340 essentially composed of homogeneous oxynitride. The tunnel oxide dielectric 340 is sandwiched between a conducting polysilicon floating gate 330 and a crystalline silicon semiconductor substrate 370. The substrate 370 includes a source region 350 and a drain region 360 that can be separated by an underlying channel region. A control gate 310 is provided adjacent to the floating gate 330, and is separated by an interpoly dielectric 320. Typically, the interpoly dielectric 320 can be composed of an oxide-nitride-oxide (ONO) structure.

The flash memory cell 300 can be adapted to form a p-channel flash memory cell or an n-channel flash memory cell depending on user preference, in accordance with embodiments of the present invention. In either case, the tunnel oxide dielectric 340 and its function remains essentially unchanged with the homogeneous oxynitride composition. Embodiments of the present inventions are well suited to implementation within a p-channel or n-channel flash memory cell.

Figure 4:
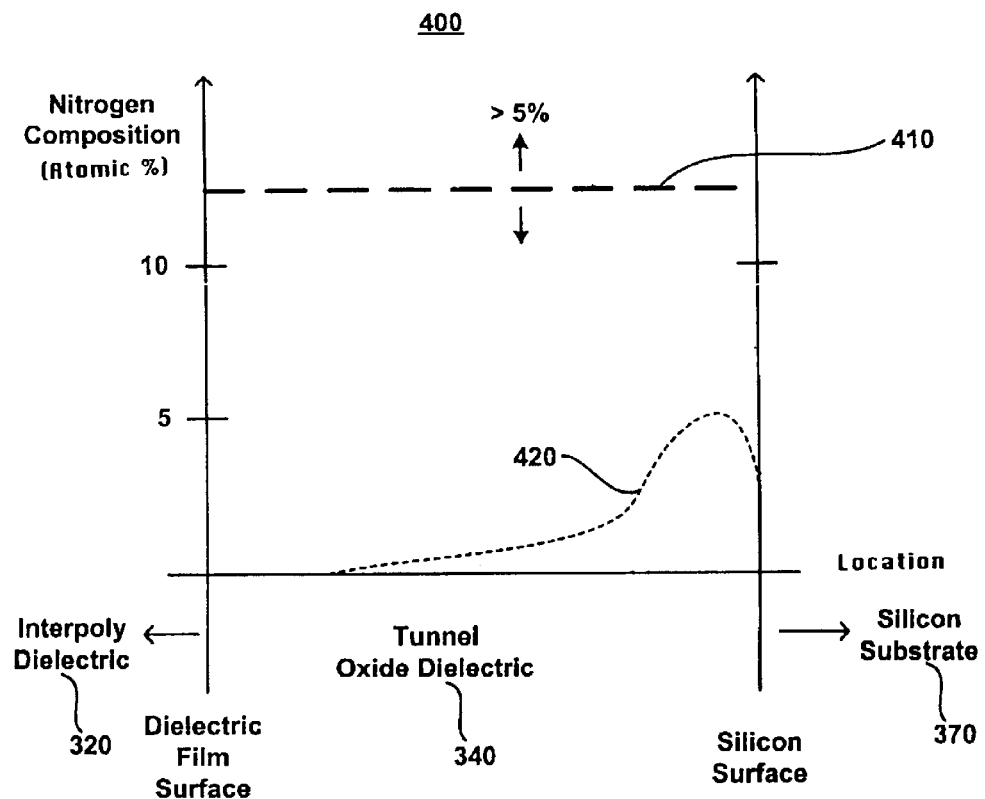
FIG. 4 is a diagram illustrating the uniform distribution of nitrogen in a homogeneous oxynitride composition for a tunnel oxide dielectric, in accordance with on embodiment of the present in invention.

The homogeneous nature of the oxynitride composition for the tunnel oxide dielectric 340 is shown in diagram 400 of FIG. 4, in accordance with one embodiment of the present invention. Along the vertical axis of diagram 400, the nitrogen composition is charted as a percentage within the tunnel oxide dielectric 340. The horizontal axis provides distance and location information for the interpoly dielectric 320, the tunnel oxide dielectric 340 and the silicon substrate 370. A dielectric film surface separates the interpoly dielectric 320 from the tunnel oxide dielectric 340. A silicon surface separates the silicon substrate 370 from the tunnel oxide dielectric 340.

FIG. 4 also graphically depicts a comparison of nitrogen distribution between conventional oxynitride and homogeneous oxynitride compositions of the tunnel oxide dielectric

340. Dotted line 420 illustrates the distribution of nitrogen for conventional forms of oxynitrite. Line 420 exhibits the non-uniform distribution of nitrogen throughout the tunnel oxide dielectric 420. Moreover, line 420 does not exceed five percent for nitrogen composition in the prior art. As a result, most of the tunnel oxide dielectric 340 is of a silicon oxide composition.

Line 410 of FIG. 4 illustrates the uniform distribution of nitrogen in a homogenous oxynitride composition for the tunnel oxide dielectric 340. As such, nitrogen is evenly distributed throughout the tunnel oxide dielectric 340. In one embodiment, the amount of nitrogen ranges between 5 to 100 percent within the tunnel oxide dielectric 340.

The homogeneous oxynitride is formed in one embodiment by boosting pure oxide with nitrogen in a nitridation process using ammonium ($NH_3$) or nitrogen oxide $N_2O$. In a second embodiment, the homogenous oxynitride is formed by oxidizing pure nitride with oxygen ($O_2$) or nitrogen oxide ($N_2O$).

Charge retention in the flash memory cell 300 is proportional to unit area capacitance. As such, a higher unit area capacitance leads to better retention of charge, and more particularly, to improved short channel effects and increased core gain (Id/W). The following equation (1) illustrates the relationship of unit area capacitance to characteristics of the flash memory cell 300.

$$\text{Capacitance} = \frac{\xi_o \xi_{oxide}}{\text{Thickness}_{tunnel\ oxide}} \quad (1)$$

where $\xi_o$ is the dielectric constant of a vacuum, and $\xi_{oxide}$ is the dielectric constant of the tunnel oxide dielectric 340. The tunnel oxide thickness is limited to a minimum thickness in order to maintain charge retention. Tunnel oxide dielectric layers thinner than the minimum thickness can lead to unwanted tunneling effects resulting in loss of charge. As a result, reducing the thickness of the tunnel oxide dielectric in order to increase capacitance is limited by the minimum thickness.

However, increasing the value of $\xi_{oxide}$ will increase the capacitance of the tunnel oxide dielectric 340. In one embodiment, the homogeneous oxynitride composition in the tunnel oxide dielectric 340 shows a substantial increase over the $\xi_{oxide}$ value of the silicon oxide in conventional flash memory cells (e.g., cell 100). As such, the unit area capacitance of the tunnel oxide dielectric 340 is also increased, while maintaining the thickness (e.g., the minimum thickness) of the dielectric 340 for increased charge retention, and more particularly, for improved short channel effects and increased core gain.

Also, the increase in the unit area capacitance may offset the loss of charge due to thinness of the tunnel oxide dielectric 340. As such, one embodiment of the present invention is able to reduce the thickness of the tunnel oxide dielectric beyond the minimum thickness, since charge retention is unaffected due to an increase in unit area capacitance due to the increased unit area capacitance.

Figure 1:
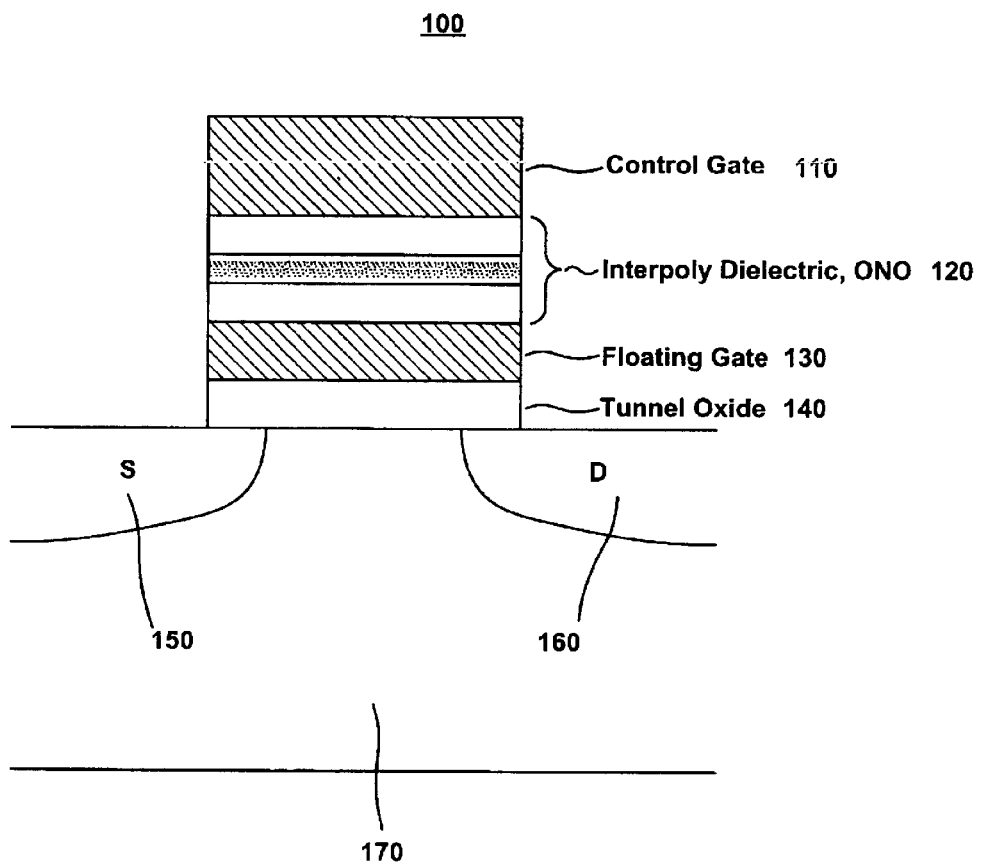
FIG. 1 is a cross sectional view of a semiconductor flash memory cell.
Figure 2:
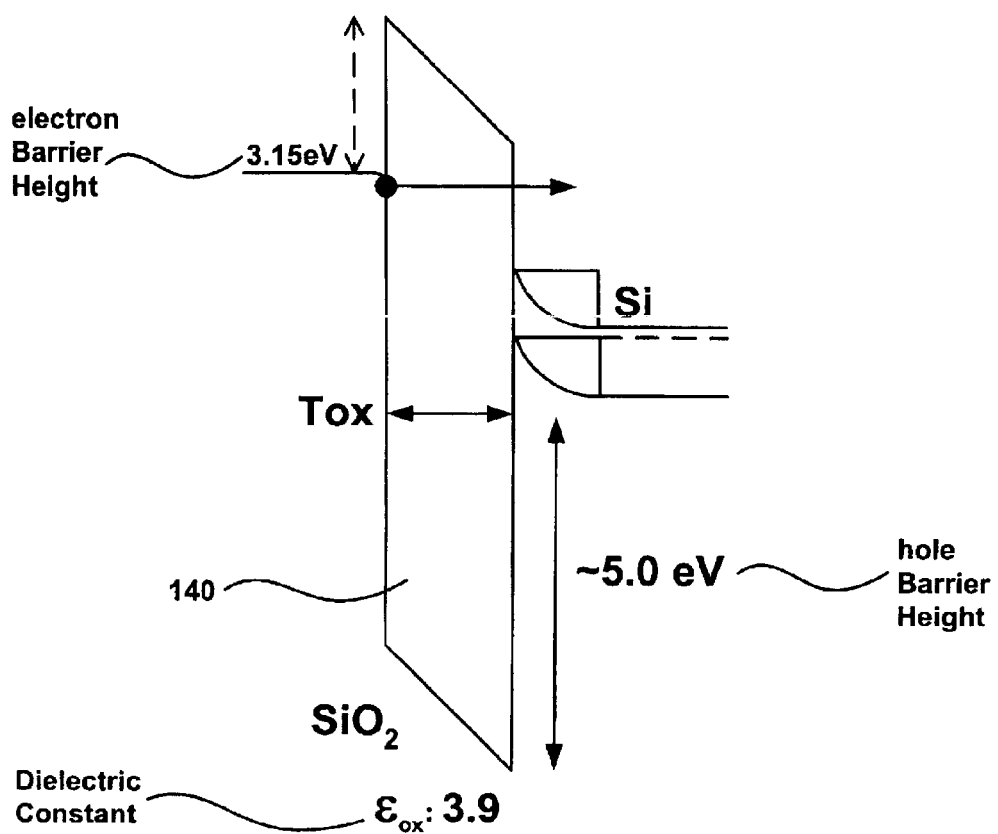
FIG. 2 is an energy band diagram associated with a tunnel oxide dielectric composed of silicon oxide of the semiconductor flash memory cell of Prior Art FIG. 1
Figure 5:
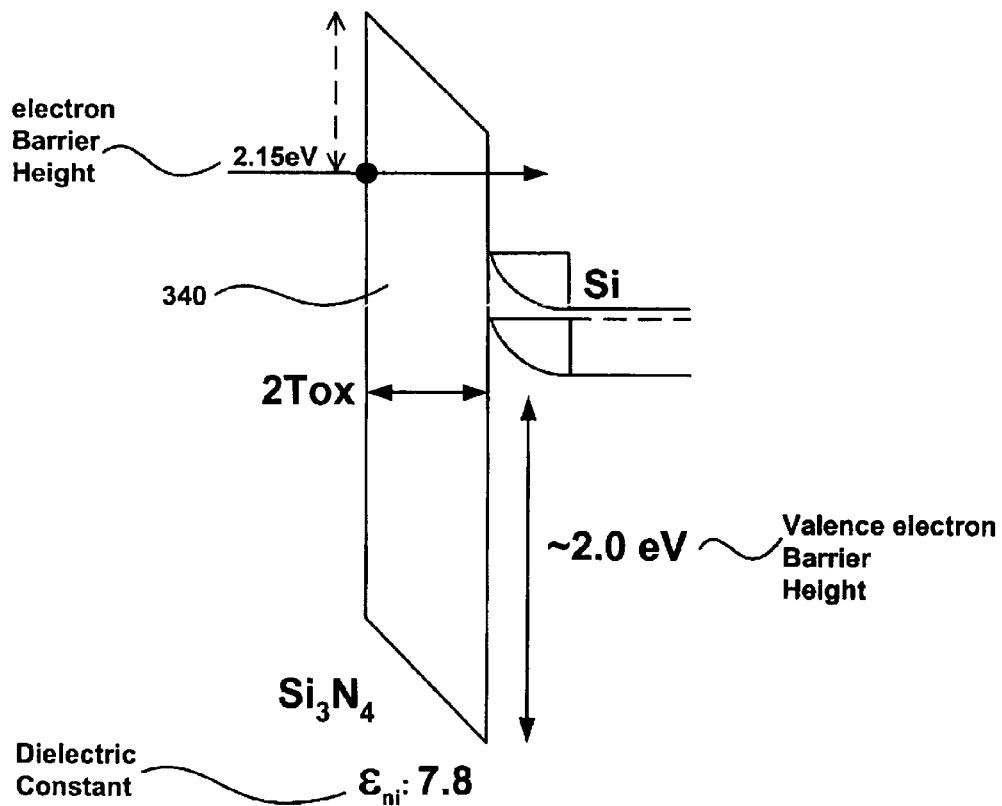
FIG. 5 is an energy band diagram associated with a tunnel oxide dielectric composed of homogeneous oxynitride, in accordance with one embodiment of the present invention.

In one embodiment, the homogeneous oxynitride is comprised of defect free silicon nitride ($Si_xN_y$). In particular, a silicon nitride composition of $Si_3N_4$ is used in one embodiment as the tunnel oxide dielectric 340. FIG. 5 illustrates an energy band diagram for the silicon nitride composition ($Si_3N_4$) of the tunnel oxide dielectric 340. As shown in FIG. 5, the $\xi_{oxide}$ value of $Si_3N_4$ is 7.8, which is substantially higher than the $\xi_{oxide}$ value of 3.9 for the silicon oxide in the prior art, as previously shown in Prior Art FIG. 2. As a result, by using homogeneous oxynitride, the unit area capacitance of the tunnel oxide dielectric 340 can be increased.

In addition, the programming and erasing of the flash memory cell 300 involves, in part, electron injection through the tunnel oxide dielectric 340. The electron injection occurring through either Fowler-Nordheim (F-N) tunneling or channel hot electron (CHE) injection is dominated by the barrier height of the tunnel oxide dielectric 340. By using the homogeneous oxynitride, the operating voltages of the flash memory cell 300 can be reduced due to the lowered barrier height of the tunnel oxide dielectric 340 over conventional silicon oxide dielectric.

Figure 6A:
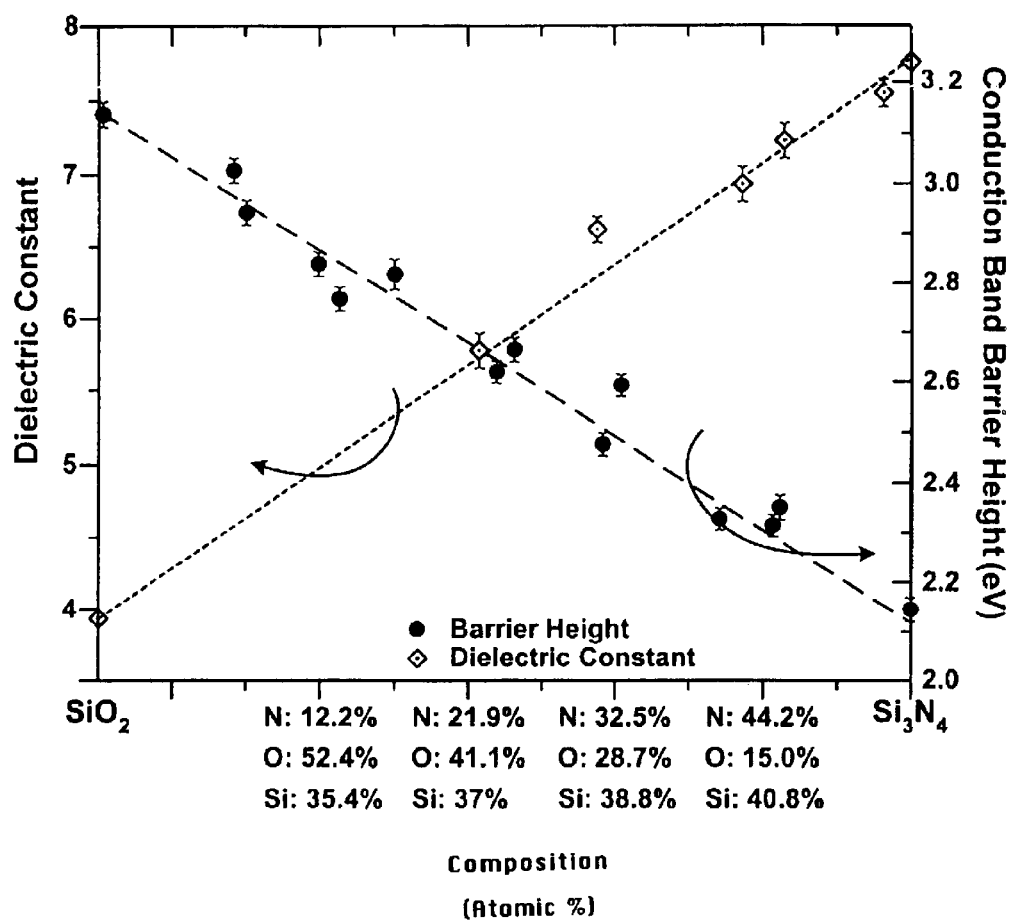
FIG. 6A is a diagram illustrating barrier heights and dielectric constants for a tunnel oxide dielectric with varying concentrations of oxygen within a homogeneous oxynitride composition, in accordance with one embodiment of the present invention.

FIG. 6A is a diagram 600A illustrating the variation of dielectric constant and conduction band barrier heights for varying concentrations of oxygen and nitrogen within the homogeneous oxynitride composition of the tunnel oxide dielectric 340 in a flash memory cell 300, in accordance with one embodiment of the present invention. As shown in diagram 600A, by varying the oxygen content in the homogeneous oxynitride, the flash memory cell can benefit from both increased dielectric constant, and lowered barrier height.

Looking further at FIG. 6A, by varying the nitrogen or oxygen content of the homogeneous oxynitride, the physical characteristics in the tunnel oxide dielectric 340 can be manipulated. For example, the dielectric constant can be increased over a range from approximately 3.9 to approximately 7.8. Also, the barrier height can be decreased over a range from approximately 3.2 eV to approximately 2.1 eV.

For example, if a homogeneous oxynitride with the equivalent of fifty percent oxide composition is used, the dielectric constant of the material will be 5.85. This allows a flash memory cell 300 to maintain the same physical thickness for the tunnel dielectric without any reduction in the charge loss characteristic. In addition, the use of homogeneous oxynitride with increased dielectric can achieve a fifty percent higher unit area capacitance for improving both short channel effect and core gain.

Figure 6B:
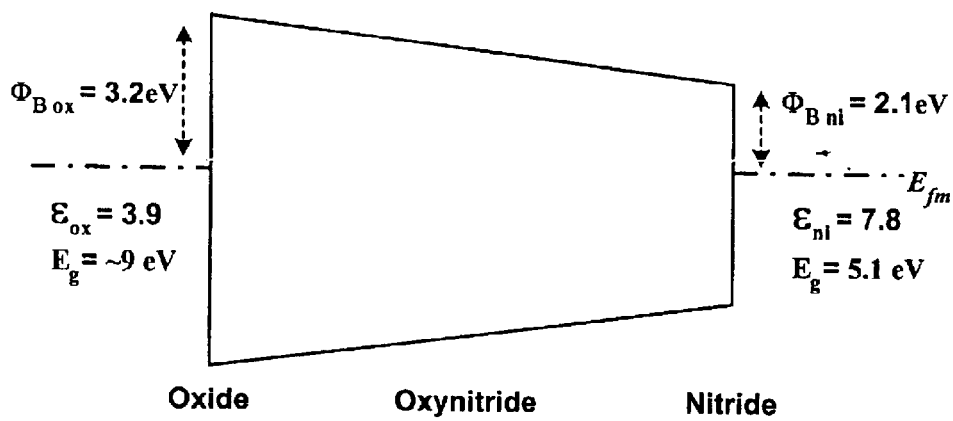
FIG. 6B is a diagram illustrating barrier heights and dielectric constants for a tunnel oxide dielectric composed of homogeneous oxynitride, in accordance with one embodiment of the present invention.

FIG. 6B is a diagram 600B illustrating the variation of dielectric constant and conduction band barrier heights for an oxynitride dielectric moving towards a pure nitride composition for the tunnel oxide dielectric 340, in accordance with one embodiment of the present invention. As shown in diagram 600B, a pure nitride composition for the tunnel oxide dielectric achieves a dielectric of 7.8 and a barrier height of 2.1 eV. In addition, the total energy gap ($E_g$) for both the electron conduction band and the valance electron conduction band is reduced to 5.1 eV.

A benefit of lowered operating voltages can result from lowering the barrier height by using a homogeneous oxynitride composition for the tunnel oxide dielectric 340. In the previously mentioned example with a fifty percent oxide composition in the homogeneous oxynitride, the electron barrier height is 2.6 eV. As a result, the programming drain voltage can be scaled down by at least 0.5 V from current devices without suffering loss of programming efficiency. Low power and low Vcc flash memory design can significantly benefit from this voltage reduction. The lower electron barrier height can also improve F-N erase efficiency, and improve device write speed.

Figure 7:
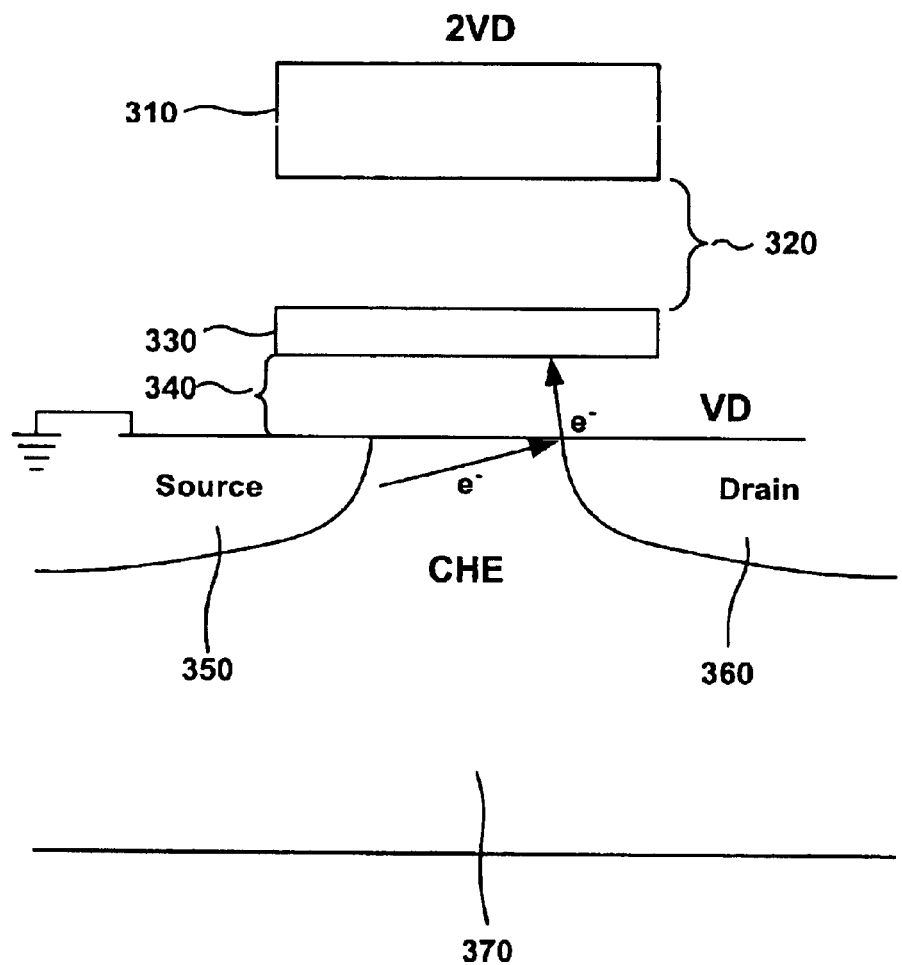
FIG. 7 is a block diagram illustrating a Fowler-Nordheim (F-N) channel hot electron (CHE) programming scheme for a tunnel oxide dielectric composed of homogeneous oxynitride, in accordance with one embodiment of the present invention.

FIG. 7 illustrates a programming state for the flash memory cell 300 of FIG. 3 including a tunnel oxide dielectric 340 comprised of homogeneous oxynitride. To program or write to the flash memory cell 300, a voltage VD of 3 to 4 volts is applied to the drain 360. This is in contrast to voltages of 4 to 5 volts applied to the drain for conventional flash memory devices including tunnel oxide dielectrics comprised of silicon oxide. In addition, a voltage of approximately 2 VD (6 to 8 volts) is applied to the control gate 310. This is in contrast to voltages of 8 to 10 volts applied to the drain from conventional flash memory devices.

Since the source 350 is coupled to ground, the flash memory cell 300 is activated and current flows from the source 350 to the drain 360. As electrons are accelerated through the channel region between the source 350 and the drain 360, impact ionization of silicon atoms in the drain 360 creates electrons and valence electrons. The electrons are attracted towards the floating gate 330 by the voltage 2 VD applied at the control gate 310. The valence electrons dissipate into the substrate 370.

Figure 8A:
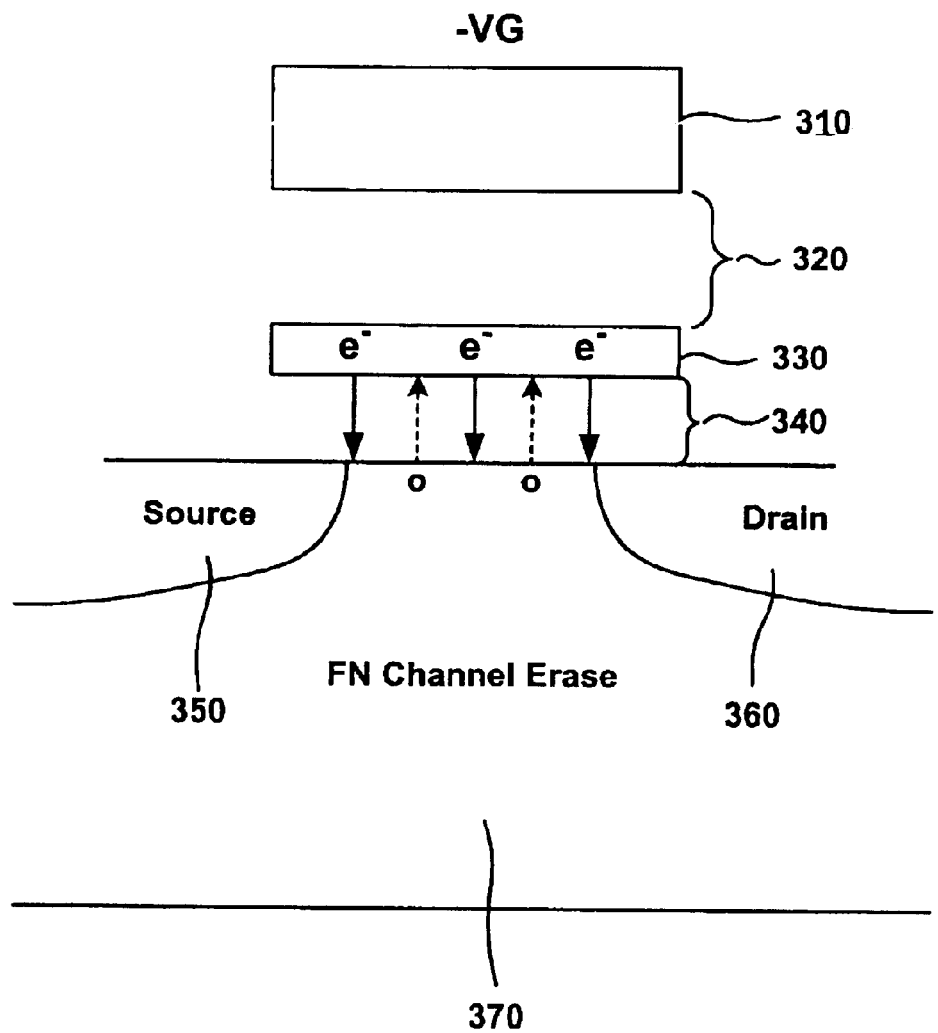
FIG. 8A is a block diagram illustrating a F-N channel erasing scheme for a tunnel oxide dielectric composed of homogeneous oxynitride, in accordance with one embodiment of the present invention.

By using homogeneous oxynitride in the tunnel oxide dielectric 340, lower operating voltages can be applied during erasing schemes using F-N tunneling, in accordance with one embodiment of the present invention. FIG. 8A is a block diagram illustrating an F-N tunneling erasing scheme as applied to a flash memory device 300, as previously introduced in FIG. 3. A high negative voltage is necessary to move electrons out from the floating gate 330. Also, the source 350 and 360 are floating during the erase. By using the homogeneous oxynitride in the tunnel oxide dielectric 340, an effective negative bias of approximately −16 volts (e.g., −VG=−16 volts, and ground coupled to the substrate) across the flash memory cell 300 will provide for erasure, while floating the source 350 and the drain 360. In comparison, a −VG of −18 volts is needed to erase conventional flash memory cells by pushing electrons out from the floating gate 330.

In addition, by virtue of the lower electron and valence electron barrier heights, both electron and valence electron movement contribute to the erasure of the flash memory cell 300. As shown in FIG. 8A, electrons tunnel across the tunnel oxide dielectric 340 from the floating gate 330 to the substrate 370. Simultaneously, valence electrons move across the tunnel oxide dielectric 340 from the substrate 370 to the floating gate 330. As such, the erase time for flash memory cell 300 using homogeneous oxynitride is significantly faster than the conventional flash memory cells using silicon oxide for the tunnel oxide dielectric.

Figure 8B:
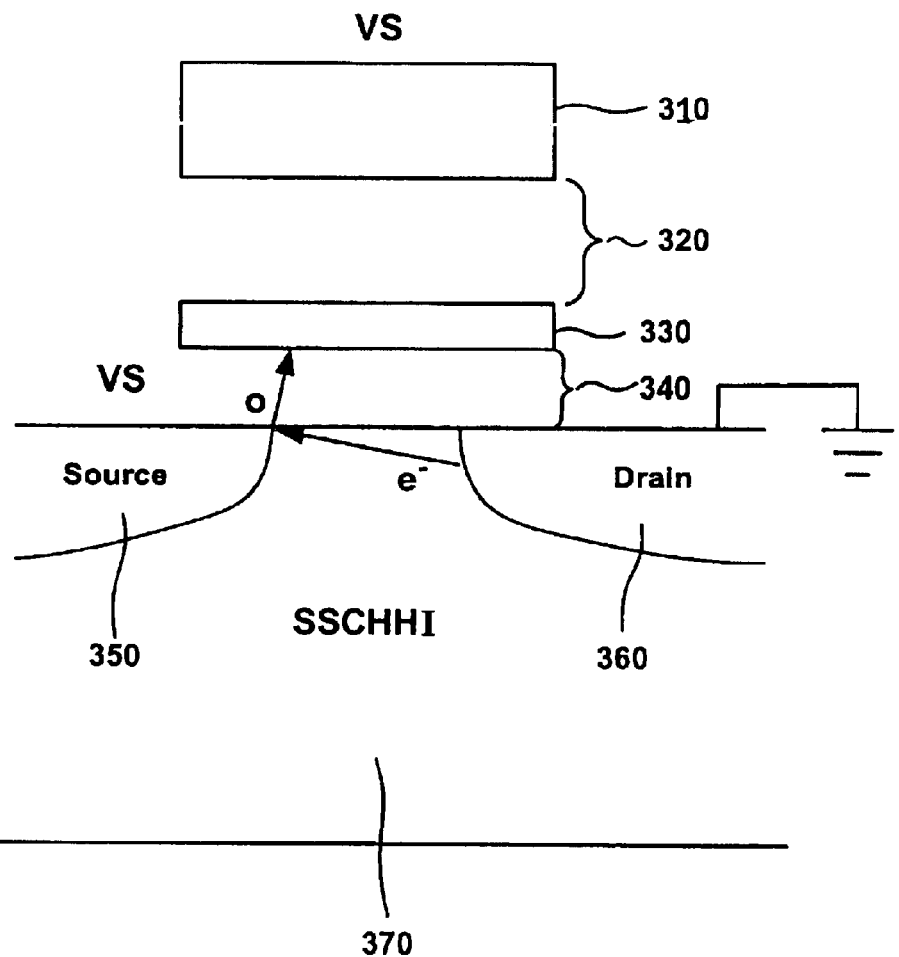
FIG. 8B is a block diagram illustrating a source side channel hot hole injection (SSCHHI) erasing scheme for a tunnel oxide dielectric composed of homogeneous oxynitride, in accordance with one embodiment of the present invention.

Moreover, the lower valence barrier height can enable a more efficient erasure scheme, source-side channel hot hole injection (SSCHHI) erase that can be implemented with the lowered operating voltages consistent with the lower electron and valance barrier height of the oxynitride tunnel oxide dielectric. FIG. 8B is a block diagram illustrating a SSCHHI erasing scheme as applied to a flash memory device 300, as previously introduced in FIG. 3. The drain 360 is grounded. The source voltage (VS) can cover a range of approximately 3 to 5 volts. The voltage applied to the gate is similar to VS and covers a range of approximately 3 to 5 volts.

Since the drain 360 is coupled to ground, an electric field is generated across the channel region between the source 350 and the drain 360, pulling electrons from the drain 360 to the source 350. As such, current flows into the source from the drain 360. As electrons are accelerated through the channel region between the source 350 and the drain 360, impact ionization of silicon atoms in the source 350 creates electrons and valence electrons. Since the control gate is negatively biased, the valance electrons (holes) are attracted towards the floating gate 330 by the voltage VS applied at the control gate 310, and neutralize the electrons stored in the floating gate 330. Conversely, the electrons are dissipated in the substrate 370.

Operating voltages can be reduced using flash memory cells including tunnel oxide dielectrics with homogeneous oxynitride. For the previously mentioned example using a fifty percent oxide composition in the homogeneous oxynitride, the valence electron barrier height is reduced to 3.5 eV from 5.0 eV allowing for better electron and valence electron movement for erasing.

For example, in one particular embodiment, a voltage of 4 volts is applied to the source 350 of FIG. 8B. A voltage of 4 volts is also applied to the control gate 310. The voltage seen at the floating gate 300 is determined by a coupling ration (e.g., 0.6) and is approximately 2.4 volts. As a result the voltage needed by the flash memory cell 300 for to perform a SSCHHI erase is between 0 to 5 volts. This is a significant improvement over the 18 volts power supply needed to perform a CHE erase in conventional flash memory cells.

In addition, an added benefit of improving device cycling endurance is realized by performing SSCHHI erasing. Doing the SSCHHI erase at the source side de-couples or separates the zone of ionization impact. This extends the longevity of the flash memory cell by spreading the deleterious impact of electron ionization impact to both the source and the drain, instead of concentrating the ionization impact to just the drain region.

In another embodiment, the lower valence barrier height can enable a more efficient erasure scheme, drain-side channel hot hole injection (DSCHHI) erase that can be implemented with the lowered operating voltages consistent with the lower electron and valance barrier height of the oxynitride tunnel oxide dielectric. The CHHI erase that is carried out on the drain side can simplify circuit design without introducing new reliability issues because it is a low energy process.

Figure 9:
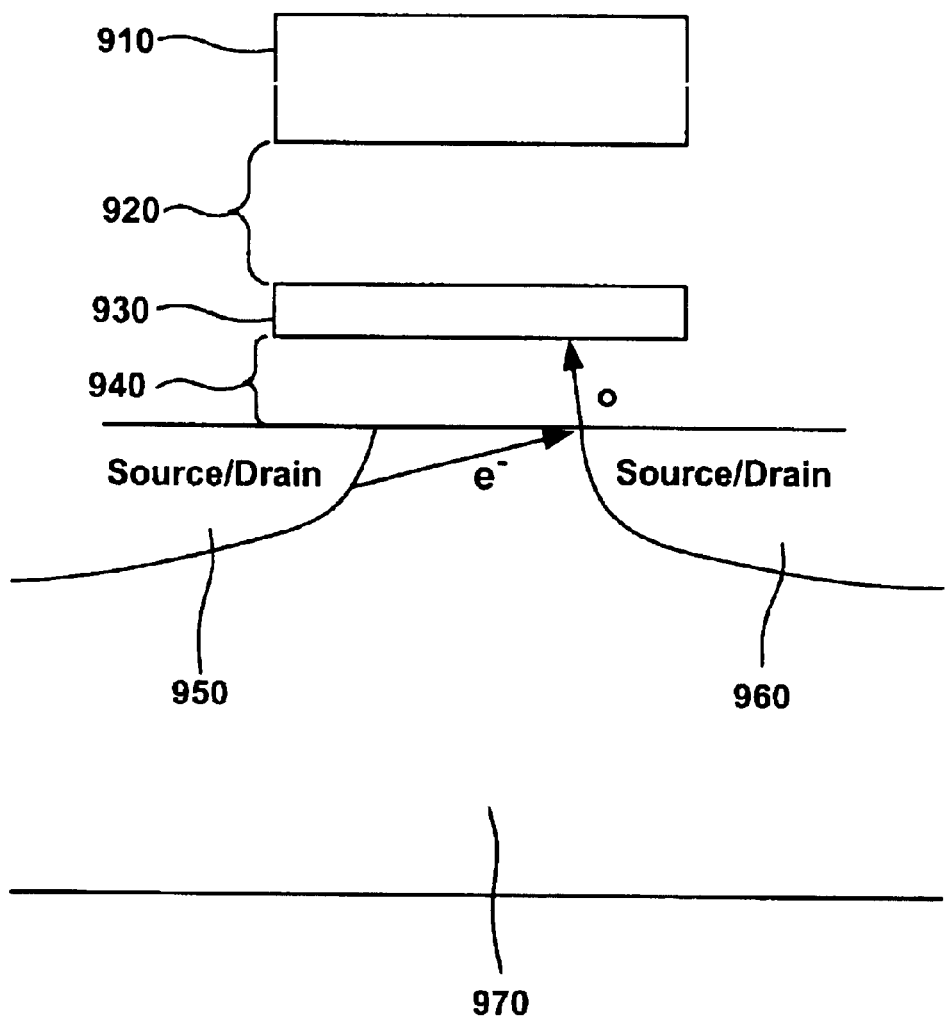
FIG. 9 is a block diagram illustrating a SSCHHI erasing scheme for dual bit flash memory cell including a tunnel oxide dielectric composed of homogenous oxynitride, in accordance with one embodiment of the present invention.

FIG. 9 is a block diagram illustrating a SSCHHI erasing scheme for dual, or mirrored, bit flash memory cell 900 including a tunnel oxide dielectric 940 composed of homogenous oxynitride, in accordance with one embodiment of the present invention. The dual bit flash memory cell 900 only comprises a single polysilicon layer. The dual bit flash memory cell 900 comprises a polysilicon control gate 910 over a interpoly dielectric 920, that is an oxide. A floating gate 930 comprising nitride separates the tunnel oxide dielectric 940 and the interpoly dielectric 920. The tunnel oxide dielectric 940 separates the floating gate 930 with a substrate 970. Regions 950 and 960 provide for source and drain regions depending on which side of the dual bit flash memory cell 900 is read or programmed.

The dual bit memory cell 900 holds twice as much data as conventional flash memory cells without compromising device endurance, performance or reliability. The doubling of storage capacity is achieved by the storage of two bits of data in one cell, without compromising data integrity. Specifically, two units of charge are stored individually, and in a different location within the dual bit memory cell 900. In one embodiment, the dual bit memory cell 900 stores individual units of charge on either side of the cell 900. As such, the left side of memory cell 900 located above source/drain 950 stores one unit of charge. Correspondingly, the right side of memory cell 900 located above source/drain 960 independently stores another unit of charge.

In this manner, the dual bit memory cell 900 is able to increase memory states from two to four. Instead of programming or reading between a 0 or 1, the dual bit memory cell 900 is able to independently program and read both the left and right sides of the memory cell 900, thus enabling four states, as follows: 00, 01, 10, and 11.

The erase scheme as illustrated in FIG. 9 is implemented by applying 4 to 6 volts on the source/drain region 960

(which is acting as a drain) to erase the right side of the dual bit flash memory device 900. The source/drain region 950 (which is acting as a source) is left floating. A voltage of 6 to 8 volts is applied to the control gate 910. Because of the band to a bind current generated between the source/drain regions 950 and 960, hole generation due to ionization impact in the source/drain region 960 causes valence electron to be generated and attracted to the floating gate 930 on the right side of the dual bit flash memory device 900. This neutralizes the electrons stored in the floating gate 930.

Alternatively, the voltage applied to the source/drain region 960 can be applied to the source/drain region 950 while leaving the source/drain region 960 to float in order to erase the left side of the dual bit flash memory device 900.

The preferred embodiment of the present invention, a method for semiconductor fabrication with reduced edge thinning of tunnel oxides for semiconductor flash memory devices, is thus described. While the present invention has been described in particular embodiments, it should be appreciated that the present invention should not be construed as limited by such embodiments, but rather construed according to the below claims.

What is claimed is:

1. A memory cell comprising:
   a floating gate;
   a channel region formed between a source region and a drain region in a substrate; and
   a tunnel oxide layer including homogeneous oxynitride separating said floating gate from said channel region, wherein a concentration for nitrogen in said tunnel oxide layer is greater than or equal to approximately fifty-eight atomic percent.

2. The memory cell as described in claim 1, wherein said homogeneous oxynitride is composed essentially of silicon nitride.

3. The memory cell as described in claim 2, wherein said silicon nitride is defect free.

4. The memory cell as described in claim 2, wherein said homogeneous oxynitride is comprised essentially of $Si_3N_4$.

5. The memory cell as described in claim 1, further comprising:
   a dielectric layer separating a control gate and said floating gate.

6. The memory cell as described in claim 1, wherein said homogeneous oxynitride comprises:
   a uniform distribution of nitrogen throughout said tunnel oxide layer.

7. The memory cell as described in claim 6, wherein said tunnel oxide layer comprises silicon nitride.

8. The memory cell as described in claim 1, wherein a barrier height associated with said tunnel oxide layer ranges between 2.0 to 3.3 electron volts.

9. The memory cell as described in claim 1, wherein said memory cell is a flash memory cell.

10. The memory cell as described in claim 1, wherein said memory cell is adapted to support a source-side channel hot hole erase.

11. A flash memory cell comprising:
    a control gate;
    a floating gate;
    a dielectric layer separating said control gate and said floating gate; and
    a tunnel oxide dielectric layer separating said floating gate from a channel region formed between a source region and a drain region in a substrate, said tunnel oxide dielectric layer essentially comprised of homogeneous silicon nitride, and wherein a concentration for nitrogen in said tunnel oxide dielectric layer is greater than or equal to approximately fifty-eight atomic percent.

12. The flash memory cell as described in claim 11, wherein said homogeneous silicon nitride comprises:
    a uniform distribution of nitrogen throughout said tunnel oxide layer.

13. The flash memory cell as described in claim 11, wherein said dielectric layer comprises:
    a first oxide layer;
    a second oxide layer; and
    a nitride layer separating said first and second oxide layers.

14. The flash memory cell as described in claim 11, wherein said homogeneous silicon nitride is comprised essentially of $Si_3N4$.

15. The flash memory cell as described in claim 11, wherein a dielectric constant of said tunnel oxide layer ranges between 3.9 to 7.8.

16. The flash memory cell as described in claim 11, wherein said channel region is an n-channel and said memory cell is an n-channel field effect transistor.

17. The flash memory cell as described in claim 11, wherein said channel region is a p-channel, and said memory cell is a p-channel field effect transistor.

18. The flash memory cell as described in claim 11, further comprising:
    a power supply of 5 volts or less adaptively coupled to said memory cell for programming and erasing.

19. The flash memory cell as described in claim 11, wherein said tunnel oxide dielectric layer has a thickness of less than 10 Angstroms.

20. A dual-sided memory cell comprising:
    a tunnel oxide layer including homogeneous silicon nitride separating a storage element from a control gate and a channel region formed between source/drain regions in a substrate, said dual-sided memory cell adapted for storing multiple bits of data, wherein a concentration for nitrogen in said tunnel oxide dielectric layer is greater than or equal to approximately fifty-eight atomic percent.

21. The dual-sided memory cell as described in claim 20 wherein said dual-sided memory cell is symmetrically structured to include
    a first side; and
    a second side, wherein said dual-sided memory cell is adapted for storing two bits of data over said first and second sides.

22. The dual-sided memory cell as described in claim 20, further comprising:
    an oxide dielectric layer separating said control gate and said storage element.

23. The dual-sided memory cell as described in claim 20, wherein said storage element is composed essentially of nitride.

24. The memory device as described in claim 20, wherein said homogeneous silicon nitride in said FET memory device comprises:
    a uniform distribution of nitrogen throughout said tunnel oxide layer.

25. The memory device as described in claim 20, wherein said homogeneous silicon nitride is comprised essentially of $Si_3N4$.

26. The memory device as described in claim 20, wherein a barrier height associated with said tunnel oxide layer ranges between 2.0 to 3.3 electron volts.

27. The memory device as described in claim 20, wherein a dielectric constant of said tunnel oxide layer ranges between 3.9 to 7.8.

* * * * *